(12) United States Patent
Fukushima et al.

(10) Patent No.: US 8,506,362 B2
(45) Date of Patent: Aug. 13, 2013

(54) POLISHING APPARATUS AND POLISHING METHOD

(75) Inventors: Dai Fukushima, Kanagawa (JP); Atsushi Shigeta, Kanagawa (JP); Tamami Takahashi, Tokyo (JP); Kenya Ito, Tokyo (JP); Masaya Seki, Tokyo (JP); Hiroaki Kusa, Tokyo (JP)

(73) Assignees: Kabushiki Kaisha Toshiba, Tokyo (JP); Ebara Corporation, Tokyo (JP)

( * ) Notice: Subject to any disclaimer, the term of this patent is extended or adjusted under 35 U.S.C. 154(b) by 685 days.

(21) Appl. No.: 12/667,891

(22) PCT Filed: Jul. 8, 2008

(86) PCT No.: PCT/JP2008/062654
§ 371 (c)(1),
(2), (4) Date: Jan. 6, 2010

(87) PCT Pub. No.: WO2009/008532
PCT Pub. Date: Jan. 15, 2009

(65) Prior Publication Data
US 2011/0003537 A1 Jan. 6, 2011

(30) Foreign Application Priority Data
Jul. 11, 2007 (JP) .................................. 2007-181617

(51) Int. Cl.
*B24B 7/26* (2006.01)
(52) U.S. Cl.
USPC ........................................... 451/168; 451/173
(58) Field of Classification Search
USPC ....................... 451/41, 44, 168, 173, 313, 317
See application file for complete search history.

(56) References Cited

U.S. PATENT DOCUMENTS

| | | | |
|---|---|---|---|
| 5,117,590 A * | 6/1992 | Kudo et al. | 451/44 |
| 6,231,429 B1 * | 5/2001 | Lisec | 451/44 |
| 6,629,875 B2 | 10/2003 | Steere, III | |
| 7,014,529 B1 * | 3/2006 | Kubota et al. | 451/7 |
| 7,217,662 B2 * | 5/2007 | Toyota et al. | 438/690 |
| 7,744,445 B2 * | 6/2010 | Kubota et al. | 451/41 |
| 8,152,598 B2 * | 4/2012 | Fukushima et al. | 451/11 |
| 2001/0011002 A1 * | 8/2001 | Steere, III | 451/168 |

(Continued)

FOREIGN PATENT DOCUMENTS

| | | |
|---|---|---|
| JP | 06-320408 | 11/1994 |
| JP | 08-155812 | 6/1996 |

(Continued)

OTHER PUBLICATIONS

International Search Report issued Aug. 19, 2008 in International (PCT) Application No. PCT/JP2008/062654.

*Primary Examiner* — Maurina Rachuba
(74) *Attorney, Agent, or Firm* — Wenderoth, Lind & Ponack, L.L.P.

(57) ABSTRACT

A polishing apparatus includes a substrate holder configured to hold and rotate a substrate, a press pad configured to press a polishing tape having a polishing surface against a bevel portion of the substrate held by the substrate holder, and a feeding mechanism configured to cause the polishing tape to travel in its longitudinal direction. The press pad includes a hard member having a pressing surface for pressing the bevel portion of the substrate through the polishing tape, and at least one elastic member for pressing the hard member against the bevel portion of the substrate through the belt-shaped polishing tool.

8 Claims, 14 Drawing Sheets

(56) References Cited

U.S. PATENT DOCUMENTS

| | | |
|---|---|---|
| 2007/0131653 A1 | 6/2007 | Ettinger et al. |
| 2008/0254719 A1* | 10/2008 | Shigeta et al. .................. 451/44 |
| 2009/0017730 A1* | 1/2009 | Kubota et al. ................... 451/41 |
| 2009/0117828 A1* | 5/2009 | Hongo et al. ..................... 451/6 |
| 2009/0124174 A1* | 5/2009 | Fukushima et al. ............ 451/44 |
| 2009/0227189 A1* | 9/2009 | Maeda et al. ................. 451/303 |
| 2010/0022166 A1* | 1/2010 | Kimba et al. ..................... 451/5 |
| 2010/0136886 A1* | 6/2010 | Hongo et al. ..................... 451/6 |

FOREIGN PATENT DOCUMENTS

| | | |
|---|---|---|
| JP | 2002-208572 | 7/2002 |
| JP | 2006-303112 | 11/2006 |
| JP | 2007-152471 | 6/2007 |
| WO | 2005/081301 | 9/2005 |
| WO | 2006/041196 | 4/2006 |
| WO | 2006/112531 | 10/2006 |

* cited by examiner

FIG.20

| | Polishing Tape | Press Pad Used | | Polishing Result | |
|---|---|---|---|---|---|
| | | Hard Member | Elastic Member | Polishing Position Controllability | Polishing Rate |
| Conventional Example | D4K / PET50um | NONE | Silicon Rubber (Hardness of 30 degrees) | × | ○ |
| Experimental Example 1 | D4K / PET25um | PET / 25um | Sponge 30° | × | ○ |
| | | PET / 50um | Sponge 30° | ○ | △ |
| | | PET / 100um | Sponge 30° | ◎ | × |
| | | PET / 100um | Sponge 10° | ◎ | ○ |
| Experimental Example 2 | D10K / PET50um | PET / 100um | Sponge 10° | △ | ◎ |
| | | PET / 0.5mm | Sponge 10° | ◎ | △ |
| | | PET / 2.0mm | Sponge 10° | ◎ | × |
| | | SUS / 0.5mm | Sponge 10° | ◎ | ○ |
| | | SUS / 0.1mm + Vertical Beams | Sponge 10° | ◎ | ◎ |
| Experimental Example 3 | D10K / PET50um | PVC / 0.5mm | Sponge 30° | ◎ | × |
| | | PVC / 0.5mm | Sponge 10° | ◎ | △ |
| | | PVC / 0.5mm | Pure Water Enclosed | ◎ | ○ |
| | | PVC / 0.5mm | Air Pressure Control | ◎ | ◎ |

POLISHING APPARATUS AND POLISHING METHOD

TECHNICAL FIELD

The present invention relates to a polishing apparatus using a polishing tape, and more particularly to a polishing apparatus and a polishing method for polishing a bevel portion of a substrate, such as a semiconductor wafer.

BACKGROUND ART

From a viewpoint of improving a yield in semiconductor fabrications, management of a surface condition in a bevel portion of a semiconductor wafer has recently been drawing attention. Since a number of materials are deposited on a semiconductor wafer repeatedly to form multilayer structures, unwanted materials and damage are left on a bevel portion which is not used for actual products. As a conventional way of transporting and holding a wafer, it has been typically practiced to bring a holding member (e.g., a robot hand) into contact with a rear surface of a wafer. However, there is an increasing demand for maintaining cleanliness of the rear surface, as microfabrication technique of a device advances and a wafer having a diameter of 300 mm becomes mainstream. Therefore, it has been more common in recent years to transfer and hold a wafer by bringing a holding member into contact with only an edge of the wafer. Under such a background, the unwanted materials and damage, left on the bevel portion, are likely to come off the wafer during various processes and can adhere to a surface of a device. Such materials, attached to the device, can affect a yield in products.

In this specification, a bevel portion is, as shown in FIG. 1, a portion B where a cross section of a periphery of a substrate has a curvature. A flat portion indicated by a symbol D in FIG. 1 is a region where devices are formed. A flat portion E extending outwardly from the device-formation region D by several millimeters is referred to as an edge portion, which is distinguished from the device-formation region D. That is, the bevel portion is a rounded section extending from the edge portion E to the rear surface of the substrate.

While a cross-sectional shape of the bevel portion varies widely depending on substrate manufacturers, the bevel portion generally includes, as shown in FIG. 1, a slope surface F adjacent to the edge portion E, an outermost vertical surface G, and a slope surface F adjacent to the rear surface. The slope surfaces F and the vertical surface G are connected to each other by smooth curved surfaces H.

A polishing apparatus using a polishing tape is known as a device for removing a film formed on the bevel portion of the substrate. This type of polishing apparatus has a press pad arranged at a rear side of the polishing tape and is configured to press a polishing surface of the polishing tape against the bevel portion of the substrate by the press pad to thereby polish the bevel portion.

FIG. 2 is a perspective view showing a conventional press pad. As shown in FIG. 2, a press pad 100 has a rectangular pressing surface 100a. This press pad 100 is disposed at the rear side of the polishing tape and presses the surface (i.e., the polishing surface) of the polishing tape against the bevel portion of the substrate with the pressing surface 100a. The press pad 100 is fabricated from rubber, sponge, or the like. For example, urethane rubber or silicon sponge with a hardness (e.g., 20 to 40 degrees) suitable for polishing is selected as a material of the press pad.

FIG. 3 is a plan view showing the press pad when pressing a wafer and when not pressing the wafer. As shown in FIG. 3, a wafer W to be polished has a disk shape. When the press pad presses the polishing tape (not shown) against the bevel portion of the wafer W, part of the pressing surface 100a of the press pad 100 is compressed as the result of contact with the wafer W. Consequently, a contact area between the polishing tape and the wafer W is increased and a polishing speed per unit time is improved.

FIG. 4 is a vertical cross-sectional view showing the press pad when pressing the polishing tape against the bevel portion of the wafer. As shown in FIG. 4, during polishing, the pressing surface 100a of the press pad 100 is deformed along the bevel portion. Consequently, polishing pressure becomes high at boundaries between a region where the polishing tape 200 is in contact with the wafer W and regions where the polishing tape 200 is separated from the wafer W as indicated by arrows in FIG. 4. Specifically, polishing pressure on the boundaries is high and polishing pressure on a central region located between these boundaries is low. This makes it difficult to polish the central region. In such a case, if polishing is performed for the purpose of completely removing a film or an organic substance (stain) on the central region, the boundaries are excessively polished.

In this case, use of a polishing tape having a thicker base member can increase the polishing pressure on the central region of the bevel portion. However, use of such a polishing tape with a thicker base member entails larger reels for supplying and recovering the polishing tape. Further, when the polishing tape with the thicker base member is used, a tension of the polishing tape can largely affect polishing of the substrate. As a result, polishing process becomes unstable.

SUMMARY OF THE INVENTION

The present invention has been made in view of the above drawbacks. It is therefore an object of the present invention to provide a polishing apparatus and polishing method capable of controlling a contact area in a lateral direction of a bevel portion of a substrate and a distribution of loads applied along a vertical direction of the bevel portion of the substrate.

In order to solve the above drawbacks, one aspect of the present invention is to provide a polishing apparatus including: a substrate holder configured to hold and rotate a substrate; a press pad configured to press a belt-shaped polishing tool having a polishing surface against a bevel portion of the substrate held by the substrate holder; and a feeding mechanism configured to cause the belt-shaped polishing tool to travel in its longitudinal direction. The press pad includes a hard member having a pressing surface for pressing the bevel portion of the substrate through the belt-shaped polishing tool, and at least one elastic member for pressing the hard member against the bevel portion of the substrate through the belt-shaped polishing tool.

In a preferred aspect of the present invention, the hard member is secured to the elastic member only at a central portion of the hard member with respect to a circumferential direction of the substrate.

In a preferred aspect of the present invention, the hard member has a rear surface opposite to the pressing surface, and the rear surface has a plurality of grooves extending in a direction perpendicular to a surface of the substrate held by the substrate holder.

In a preferred aspect of the present invention, the hard member has a rear surface opposite to the pressing surface, and a plurality of reinforcing members, extending in a direction perpendicular to a surface of the substrate held by the substrate holder, are provided on the rear surface.

In a preferred aspect of the present invention, the at least one elastic member comprises multiple elastic members arranged along a circumferential direction of the substrate.

In a preferred aspect of the present invention, the at least one elastic member has at least one fluid chamber therein, and the at least one fluid chamber is filled with fluid.

In a preferred aspect of the present invention, the at least one fluid chamber comprises multiple fluid chambers, and the polishing apparatus further comprises a pressure adjuster configured to adjust internal pressures of the multiple fluid chambers independently.

Another aspect of the present invention is to provide a polishing method including: holding and rotating a substrate; moving a belt-shaped polishing tool in its longitudinal direction; arranging a press pad having a hard member and an elastic member such that the hard member faces a rear surface of the belt-shaped polishing tool; and causing the press pad to press a polishing surface of the belt-shaped polishing tool against a bevel portion of the substrate to polish the bevel portion.

According to the present invention, since the pressing surface is not compressed greatly when contacting the bevel portion, high polishing pressure can be applied to the central region of the bevel portion. Therefore, the polishing tool can polish the central region of the bevel portion effectively without excessively polishing the boundaries at both sides of the central region of the bevel portion. Further, since the hard member is bent along the circumferential direction of the bevel portion, the contact area can be increased and a polishing rate can be improved.

BRIEF DESCRIPTION OF DRAWINGS

FIG. 20 a diagram showing results of experiments in which the hard members and the elastic members with different materials and thicknesses were used in the press pad according to the second embodiment of the present invention.

DETAILED DESCRIPTION OF THE INVENTION

A polishing apparatus according to embodiments of the present invention will be described below with reference to the drawings.

Figure 5:
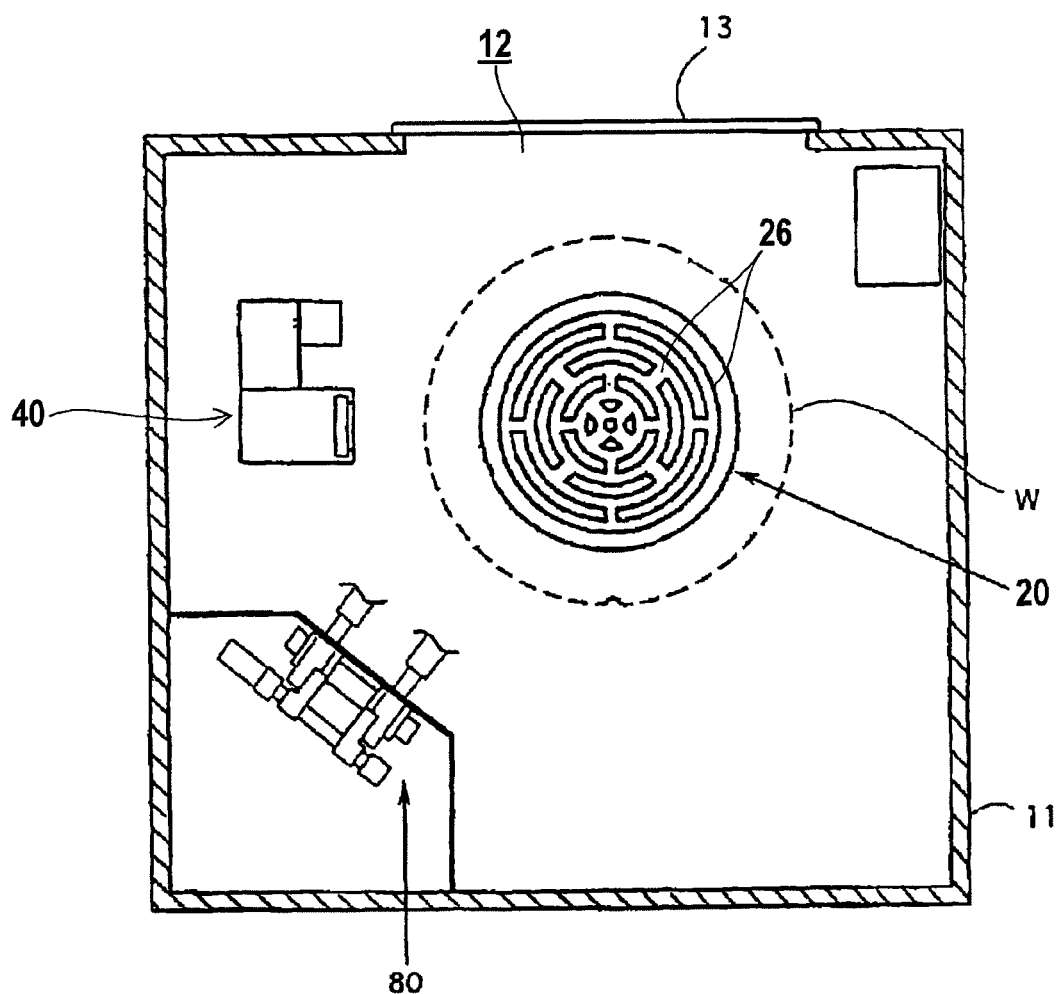
FIG. 5 is a plan view showing a polishing apparatus according to a first embodiment of the present invention.
Figure 6:
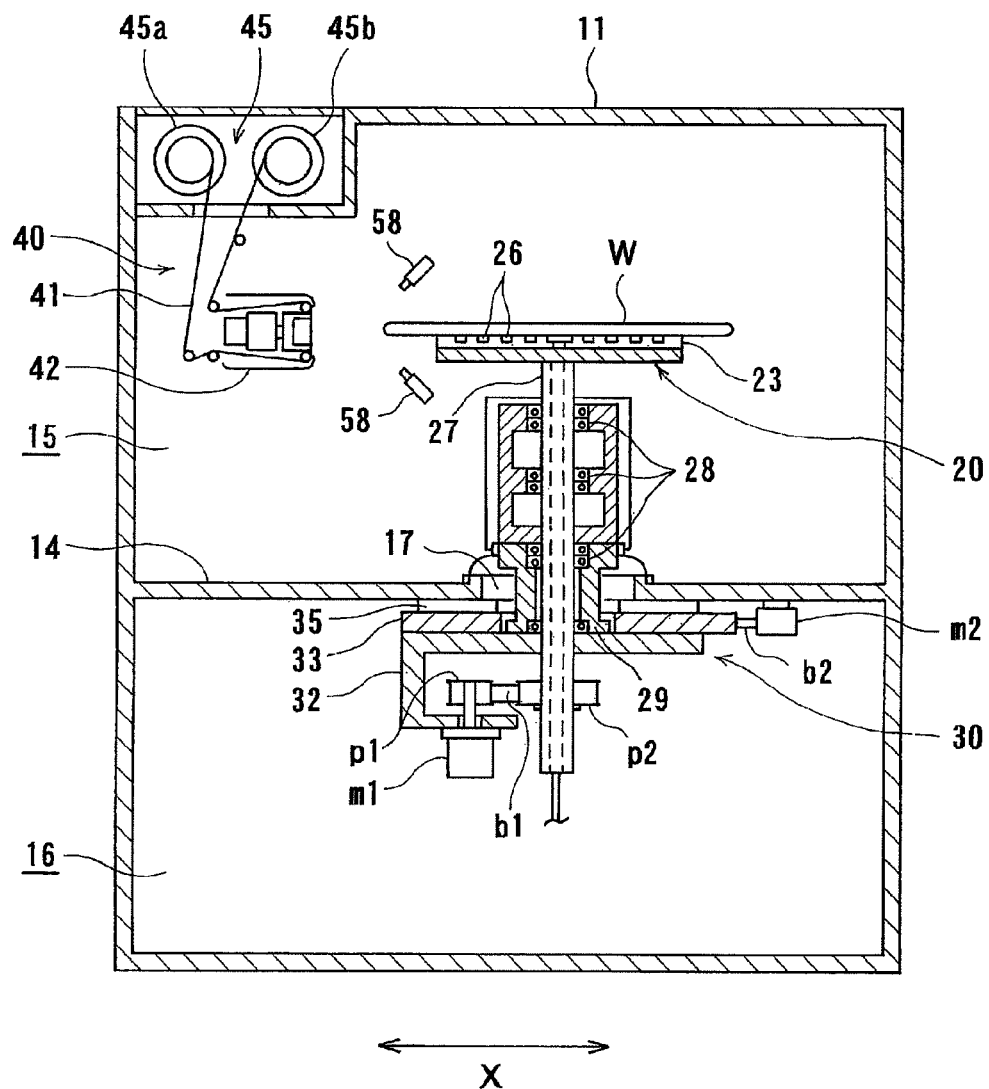
FIG. 6 is a cross-sectional view of the polishing apparatus shown in FIG. 5.

FIG. 5 is a plan view showing a polishing apparatus according to a first embodiment of the present invention. FIG. 6 is a cross-sectional view of the polishing apparatus shown in FIG. 5.

As shown in FIG. 5 and FIG. 6, the polishing apparatus according to the present embodiment includes a wafer stage unit 20 having a wafer stage 23 for holding a wafer W, a stage moving mechanism 30 configured to move the wafer stage unit 20 in a direction parallel to an upper surface (wafer holding surface) of the wafer stage 23, and a bevel polishing unit 40 configured to polish a bevel portion of the wafer W held by the wafer stage 23.

The wafer stage unit 20, the stage moving mechanism 30, and the bevel polishing unit 40 are contained in a housing 11. The housing 11 is partitioned by a partition plate 14 into two spaces: an upper chamber (a polishing chamber) 15 and a lower chamber (a mechanical chamber) 16. The above-mentioned wafer stage 23 and the bevel polishing unit 40 are located in the upper chamber 15, and the stage moving mechanism 30 is located in the lower chamber 16. The upper chamber 15 has a side wall with an opening 12. This opening 12 is closed by a shutter 13 which is driven by an air cylinder (not shown).

The wafer W is transported into and from the housing 11 through the opening 12. Transporting of the wafer W is performed by a known wafer transporting mechanism (not shown), such as a transport robot hand.

An upper surface of the wafer stage 23 has a plurality of grooves 26. These grooves 26 communicate with a vacuum pump (not shown) via a vertically extending hollow shaft 27. When the vacuum pump is operated, vacuum is produced in the grooves 26, whereby the wafer W is held on the upper surface of the wafer stage 23. The hollow shaft 27 is rotatably supported by bearings 28, and further the hollow shaft 27 is coupled to a motor m1 via pulleys p1, p2 and a belt b1. With these configurations, the wafer W is rotated by the motor m1, with being held on the upper surface of the wafer stage 23.

The polishing apparatus further includes a wafer chucking mechanism 80 disposed in the housing 11. The wafer chucking mechanism 80 is configured to receive the wafer W, which has been transported into the housing 11 by the above-mentioned wafer transporting mechanism, and place the wafer W onto the wafer stage 23. Further, the wafer chucking mechanism 80 is configured to remove the wafer W from the wafer stage 23 and transport the wafer W to the above-mentioned wafer transporting mechanism. Only part of the wafer chucking mechanism 80 is shown in FIG. 5.

Figure 7:
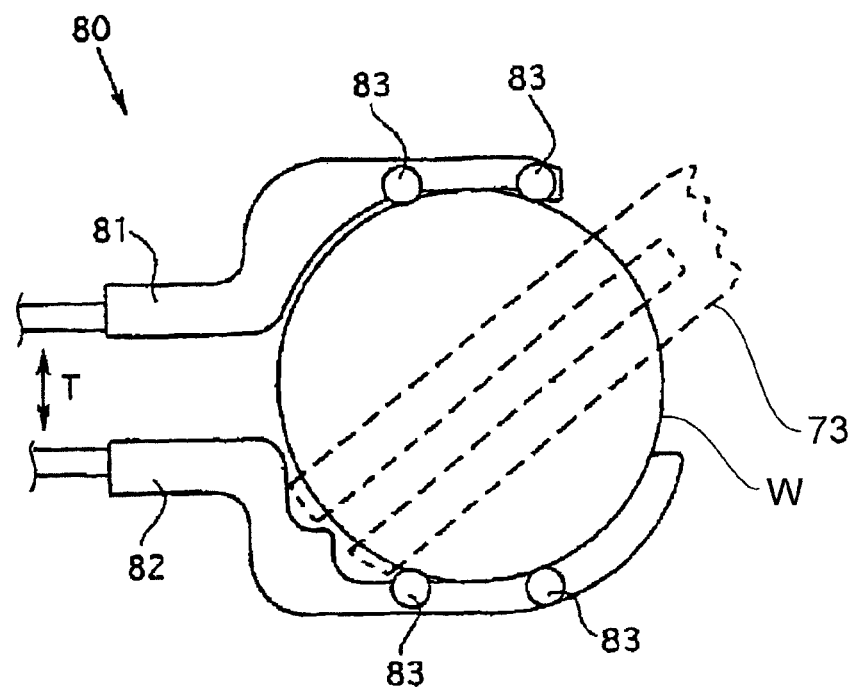
FIG. 7 is a plan view showing chuck hands of a wafer chucking mechanism.

FIG. 7 is a plan view showing chuck hands of the wafer chucking mechanism 80. As shown in FIG. 7, the wafer chucking mechanism 80 has a first chuck hand 81 having a plurality of pins 83 and a second chuck hand 82 having a plurality of pins 83. These first chuck hand 81 and second chuck hand 82 are moved closer to and away from each other (as indicated by arrows T) by an opening and closing mechanism (not shown). Further, the first chuck hand 81 and the second chuck hand 82 are moved in a direction perpendicular to the surface of the wafer W held by the wafer stage 23 by a chuck moving mechanism (not shown).

A hand 73 of the wafer transporting mechanism transports the wafer W to a position between the first chuck hand 81 and the second chuck hand 82. When the first chuck hand 81 and the second chuck hand 82 are moved closer to each other, the pins 83 are brought into contact with the periphery of the wafer W, whereby the wafer W is held by the first chuck hand 81 and the second chuck hand 82. A center of the wafer W when held by the chuck hands 81 and 82 and a center of the wafer stage 23 (i.e., a rotational axis of the wafer stage 23) agree with each other. Therefore, the first chuck hand 81 and the second chuck hand 82 also function as a centering mechanism.

As shown in FIG. 6, the stage moving mechanism 30 includes a cylindrical bearing base 29 configured to rotatably support the hollow shaft 27, a support plate 32 to which the bearing base 29 is secured, a movable plate 33 which is movable together with the support plate 32, a ball screw b2 coupled to the movable plate 33, and a motor m2 configured to rotate the ball screw b2. The movable plate 33 is coupled to a lower surface of the partition plate 14 via linear guides 35 that allow the movable plate 33 to move in a direction parallel to the upper surface of the wafer stage 23. The bearing base 29 extends through a through-hole 17 of the partition plate 14. The above-mentioned motor m1 for rotating the hollow shaft 27 is secured to the support plate 32.

In these configurations, when the ball screw b2 is rotated by the motor m2, the movable plate 33, the bearing base 29, and the hollow shaft 27 move in the longitudinal direction of the linear guides 35 to allow the wafer stage 23 to move in the direction parallel to the upper surface of the wafer stage 23. In FIG. 6, the moving direction of the wafer stage 23 by the stage moving mechanism 30 is indicated by arrows X.

As shown in FIG. 6, the bevel polishing unit 40 includes a polishing tape (a belt-shaped polishing tool) 41, a polishing head 42 configured to press the polishing tape 41 against the bevel portion of the wafer W, and a tape feeding mechanism 45 configured to feed the polishing tape 41 to the polishing head 42. The tape feeding mechanism 45 includes a feed roller 45a for feeding the polishing tape 41 to the polishing head 42, a take-up roller 45b for winding the polishing tape 41 that has been supplied to the polishing head 42, and a rotating mechanism (not shown) for rotating the take-up roller 45b. The polishing head 42 lies in the same plane as the wafer W held on the wafer stage 23.

When the rotating mechanism rotates the take-up roller 45b, the polishing tape 41 is fed to the polishing head 42 from the feed roller 45a. The polishing tape 41 travels in a direction perpendicular to the surface of the wafer W held by the wafer stage 23 and is wound on the take-up roller 45b.

The polishing tape 41 can be constituted by a base film and abrasive particles, such as diamond particles or SiC particles, bonded to one-side surface of the base film. This surface with the abrasive particles provides the polishing surface. The abrasive particles to be bonded to the polishing tape 41 are selected according to a type of wafer W and a required capability. Examples of the abrasive particles to be used include diamond particles and SiC particles having an average diameter ranging from 0.1 μm to 5.0 μm. A belt-shaped polishing cloth with no abrasive particles can also be used. The base film may be a film made from a flexible material, such as polyester, polyurethane, or polyethylene terephthalate.

Figure 8:
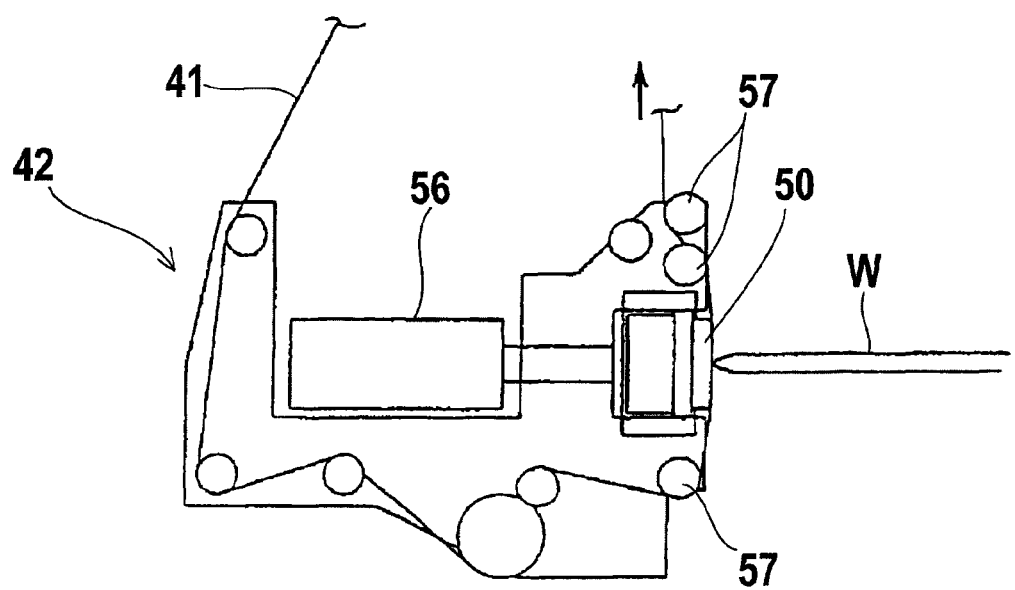
FIG. 8 is an enlarged view of a polishing head.

FIG. 8 is an enlarged view of the polishing head 42. As shown in FIG. 8, the polishing head 42 includes a press pad 50 disposed at the rear side of the polishing tape 41, a pressing mechanism (i.e., an air cylinder) 56 coupled to the press pad 50, and a plurality of guide rollers 57 guiding the traveling direction of the polishing tape 41 to a direction perpendicular to the surface of the wafer W. The pressing mechanism 56 is configured to move the press pad 50 toward the wafer W to thereby cause the press pad 50 to press the polishing surface of the polishing tape 41 against the bevel portion of the wafer W. As shown in FIG. 6, polishing liquid supply nozzles 58 are disposed above and below the wafer W, respectively, so that a polishing liquid, cooling water, and the like are supplied onto a contact region between the wafer W and the polishing tape 41.

Next, operation of the polishing apparatus thus constructed will be described. The wafer W is transported into the housing 11 through the opening 12 by the wafer transporting mechanism (not shown). The wafer chucking mechanism 80 receives the wafer W from the hands 73 (see FIG. 7) of the wafer transporting mechanism and grasps the wafer W with the first and second chuck hands 81 and 82. After transporting the wafer W to the first and second chuck hands 81 and 82, the hands 73 of the wafer transporting mechanism move outside the housing 11 and then the shutter 13 is closed. The wafer chucking mechanism 80 holding the wafer W lowers the wafer W and places the wafer W onto the upper surface of the wafer stage 23. Then, the vacuum pump (not shown) is set in motion to attract the wafer to the upper surface of the wafer stage 23.

Thereafter, the wafer stage 23, together with the wafer W, is moved closer to the polishing head 42 by the stage moving mechanism 30. Subsequently, the wafer stage 23 is rotated by the motor m1 and then, supply of the polishing liquid onto the wafer W from the polishing liquid supply nozzles 58 is started. When a rotational speed of the wafer W and a flow rate of the polishing liquid reach predetermined values, the stage moving mechanism 30 moves the wafer W to bring the wafer W into contact with the polishing tape 41. At this time, the press pad 50 projects toward the wafer W by the pressing mechanism 56. The wafer W is moved by the stage moving mechanism 30 to a position where the bevel portion of the wafer W pushes back the press pad 50 and a pressing force of the pressing mechanism 56 acts on the bevel portion of the wafer W, whereby the polishing surface of the polishing tape 41 is pressed against the bevel portion of the wafer W. In this manner, the bevel portion of the wafer W is polished.

Figure 9:
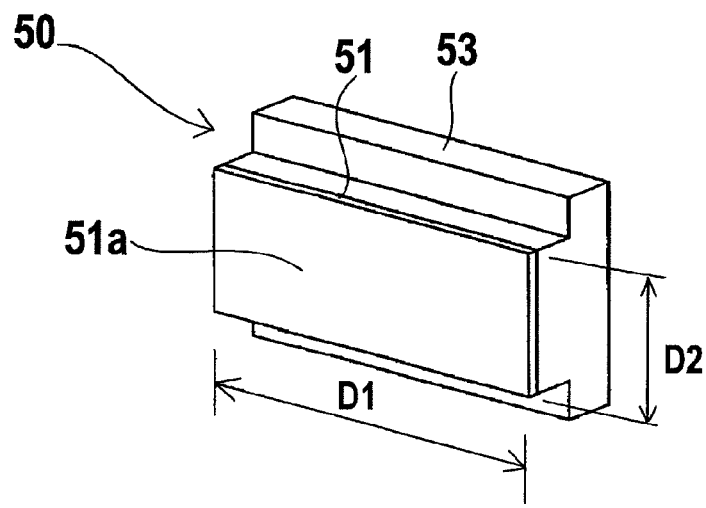
FIG. 9 is a perspective view showing a press pad incorporated in the polishing head shown in FIG. 8.

Next, the press pad 50 incorporated in the aforementioned polishing head 42 will be described in detail. FIG. 9 is a perspective view showing the press pad 50 incorporated in the polishing head 42 shown in FIG. 8.

As shown in FIG. 9, the press pad 50 has a plate-shaped hard member (pressing section) 51 having a flat pressing surface 51a and an elastic member (pad body) 53 to which the hard member 51 is fixed. The press pad 50 is disposed such that the pressing surface 51a faces the bevel portion of the wafer W held by the wafer stage 23 (see FIG. 6).

The pressing surface 51a has a rectangular shape, and a width (i.e., a dimension along a circumferential direction of the wafer W) D1 thereof is larger than a height (i.e., a dimension along a direction perpendicular to the surface of the wafer W) D2 thereof. The hard member 51 is made from rigid plastic (rigid resin), such as PET (polyethylene terephthalate) or PVC (polyvinyl chloride), or metal such as stainless steel. Use of such materials allows the hard member 51 to function as an elastic element having flexibility like a flat spring. On the other hand, the elastic member 53 is made from sponge to function as a deformable soft elastic element. In the present embodiment, the hard member 51 is made from PVC having a thickness of 0.5 mm and the elastic member 53 is made from silicon sponge having a hardness of about 10 degrees.

The hard member 51 is provided on the elastic member 53, with only a central portion of the hard member 51 being secured to the elastic member 53. Specifically, while an entire rear surface at the opposite side of the pressing surface 51a of the hard member 51 is in contact with the elastic member 53, only the central portion of the hard member 51 is fixed to the elastic member 53. The central portion of the hard member 51 means a central portion of the hard member 51 with respect to the circumferential direction of the wafer W held on the wafer stage 23 (see FIG. 6).

Figure 10:
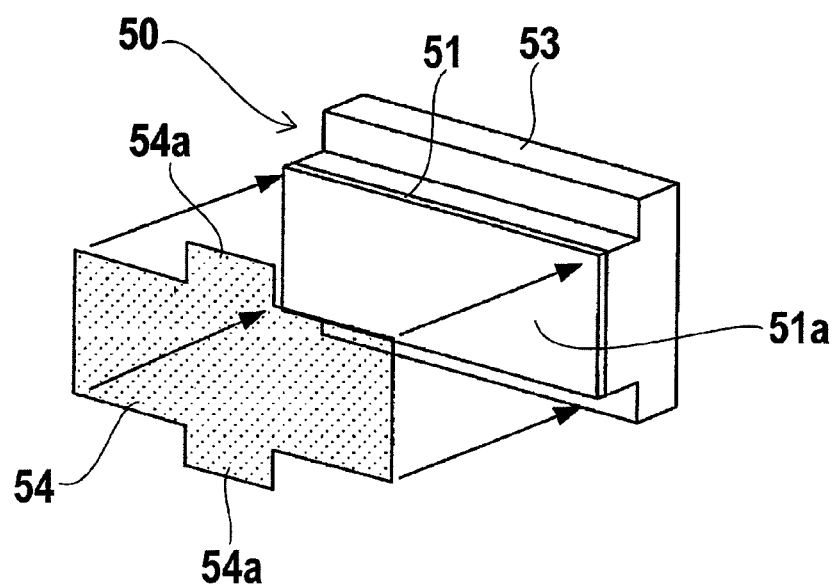
FIG. 10 is a perspective view for explaining one example of a method of fixing a hard member to an elastic member.
Figure 11:
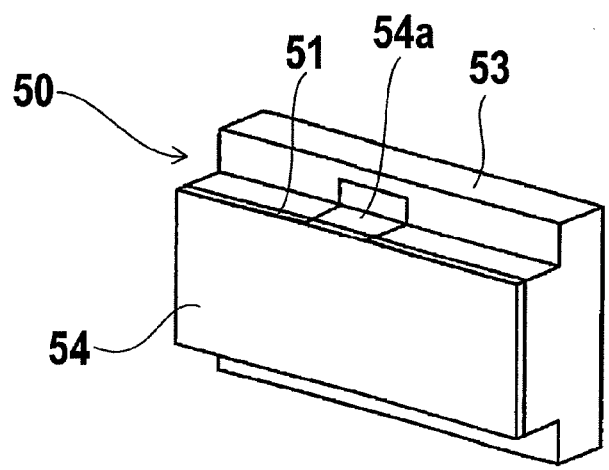
FIG. 11 is a perspective view showing the press pad in a state in which the hard member is fixed to the elastic member according to the method shown in FIG. 10.

FIG. 10 is a perspective view for explaining one example of a method of attaching the hard member 51 to the elastic member 53. FIG. 11 is a perspective view showing the press pad in a state in which the hard member 51 is secured to the elastic member 53 according to the method shown in FIG. 10. As shown in FIG. 10, first, a substantially cruciform thin adhesive sheet 54 is prepared. This adhesive sheet 54 has protrusions 54a projecting upward and downward only at a central portion thereof. The hard member 51 is overlaid on the elastic member 53 and then the adhesive sheet 54 is attached to the pressing surface 51a. Then, the upper and lower protrusions 54a of the adhesive sheet 54 are glued to the pad body 53.

Figure 12:
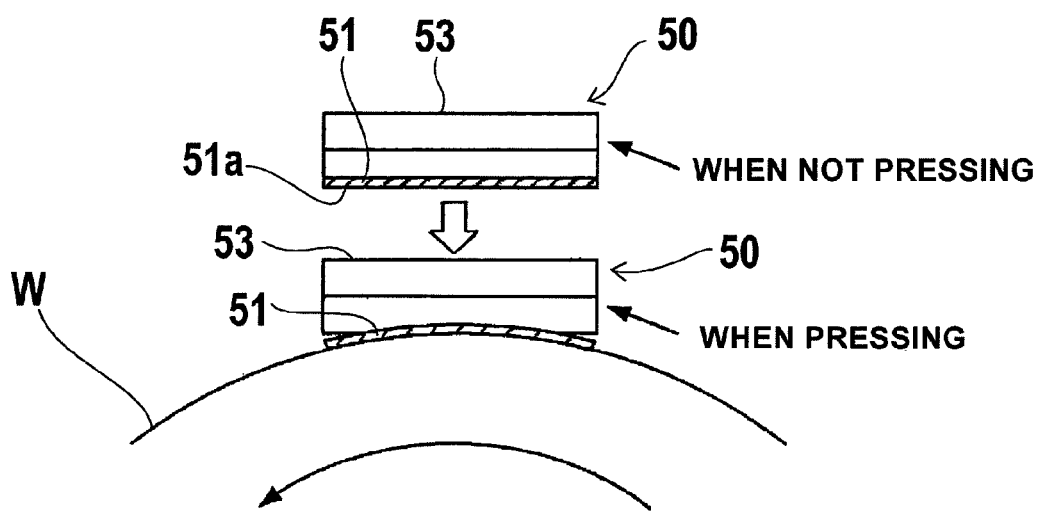
FIG. 12 is a plan view showing the press pad when pressing the wafer and when not pressing the wafer.

FIG. 12 is a plan view showing the press pad when pressing the wafer and when not pressing the wafer. The polishing tape 41 is not shown in FIG. 12. As shown in FIG. 12, when the press pad 50 is away from the wafer W, the hard member 51 maintains its shape as it is, and the pressing surface 51a is kept flat. On the other hand, when the press pad 50 presses the wafer W, the hard member 51 is bent in the circumferential direction along the bevel portion of the wafer W. This is because only the central portion of the hard member 51 is secured to the elastic member 53 by the adhesive sheet 54. Specifically, the central portion of the hard member 51 is pushed into the elastic member 53 as a result of contact with the wafer W, thereby causing both sides of the hard member 51 to separate from the elastic member 53. Accordingly, the hard member 51 is bent in the circumferential direction along the bevel portion of the wafer W.

Since the hard member 51 in its entirety is bent in this manner, the pressing surface 51a contacts the bevel portion of the wafer W over an entire length of the pressing surface 51a. Therefore, the contact area between the polishing tape and the wafer W can be increased and the polishing rate can thus be increased.

Figure 13:
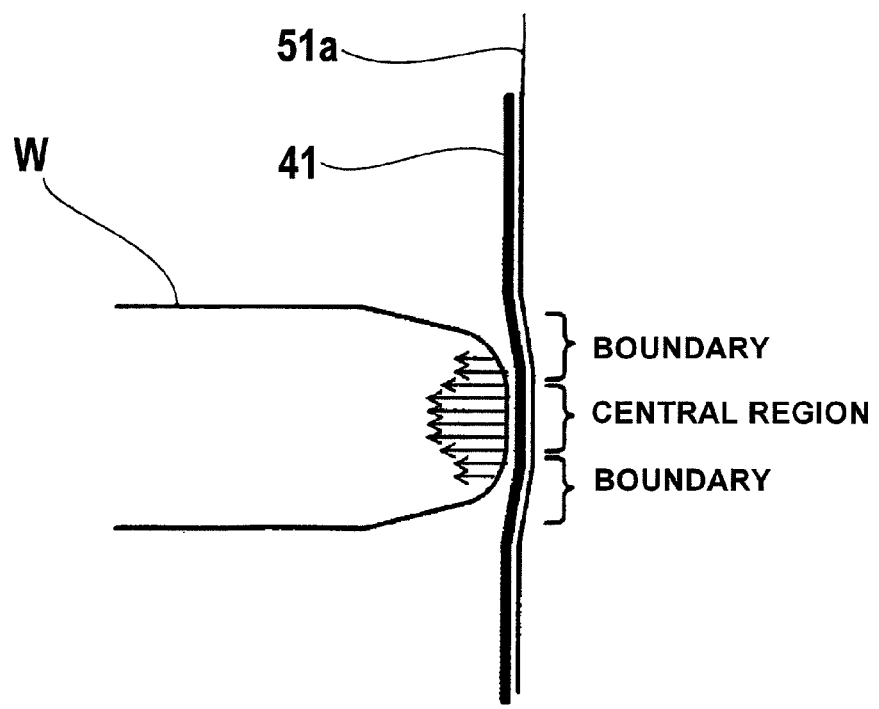
FIG. 13 is a vertical cross-sectional view showing the press pad when pressing a polishing tape against the bevel portion of the wafer.

FIG. 13 is a vertical cross-sectional view showing the press pad 50 when pressing the polishing tape 41 against the bevel portion of the wafer W. Because the hard member 51 is made from rigid plastic or metal, the pressing surface 51a is less likely to be compressed when contacting the bevel portion, compared with a case of pressing the polishing tape with a conventional press pad made from sponge or rubber. Specifically, rigidity of the hard member 51 can prevent the pressing surface 51a from following the shape of the wafer W in the direction perpendicular to the surface of the wafer W. As a result, polishing pressure applied to the wafer W increases at the central region of the bevel portion. Therefore, the central region of the bevel portion can be polished well.

Figure 14A:
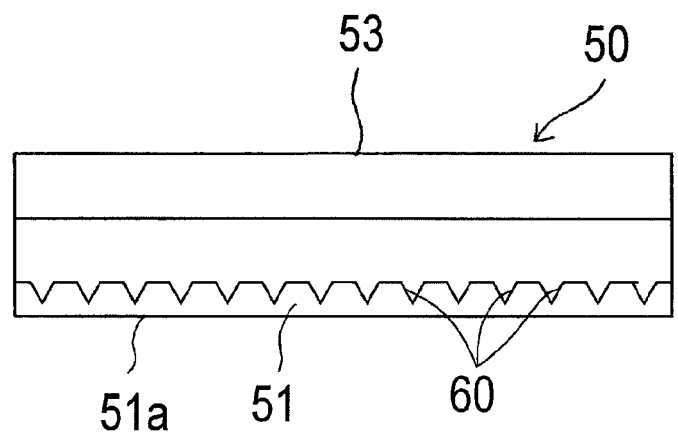
FIG. 14A and FIG. 14B are plan views each showing another example of the press pad.
Figure 14B:
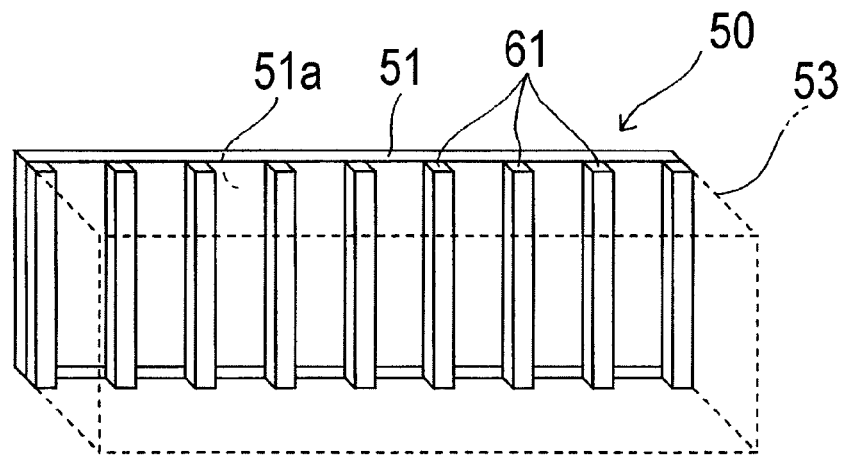

FIG. 14A and FIG. 14B are plan views each showing another example of the press pad 50. Structures of the press pad, which will not be described particularly, are identical to those of the press pad shown in FIG. 9, and repetitive explanations are omitted. In the example shown in FIG. 14A, a plurality of grooves 60, extending in the direction perpendicular to the surface of the wafer W held on the wafer stage 23 (see FIG. 6), are formed on the rear surface of the hard member 51. These grooves are arranged in parallel to each other at equal intervals and each groove has a triangular cross section.

These grooves 60 serve to enable controlling of a curvature of the hard member 51 when bent along the circumferential direction of the wafer W, and also serve to enhance the flexural rigidity of the hard member 51 in the direction perpendicular to the surface of the wafer W. Therefore, the hard member 51 is not compressed greatly along the vertical cross-sectional shape of the bevel portion of the wafer W, and the hard member 51 can press the bevel portion with the flatter pressing surface 51a. The flexural strength of the hard member 51 in the circumferential direction and the vertical direction with respect to the wafer W can be adjusted by modifying depth, shape, and the number of grooves 60 to be formed. Therefore, the press pad 50 is able to have optimum elasticity for polishing the bevel portion.

In the example shown in FIG. 14B, a plurality of beams 61, extending in the direction perpendicular to the surface of the wafer W held on the wafer stage 23, are fixed to the rear surface of the hard member 51. These beams 61 are arranged in parallel to each other at equal intervals. The beams 61 are made from the same material as the hard member 51 in the present embodiment, but the beams 61 may be made from different material.

These beams 61 function as a reinforcing member for the hard member 51 and can enhance the flexural rigidity of the hard member 51 in the direction perpendicular to the surface of the wafer W (i.e., in the vertical direction). Therefore, the hard member 51 can be made thin, while maintaining its flexural rigidity in the vertical direction, and the hard member 51 can be easily bent along the circumferential direction of the wafer W. The flexural strength of the hard member 51 in the circumferential direction and the vertical direction with respect to the wafer W can be adjusted by modifying thickness and the number of beams 61.

Next, a second embodiment of the present invention will be described. Structures of the second embodiment, which will not be described particularly, are identical to those of the first embodiment, and repetitive explanations are omitted. Further, in the second embodiment, identical or corresponding elements are denoted by the same terms and the same reference numerals and will not be described below repetitively.

Figure 15A:
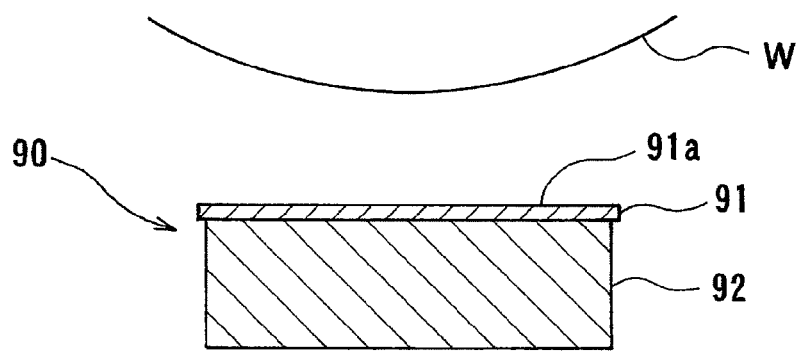
FIG. 15A is a cross-sectional view showing a press pad used in a polishing apparatus according to a second embodiment of the present invention.
Figure 15B:
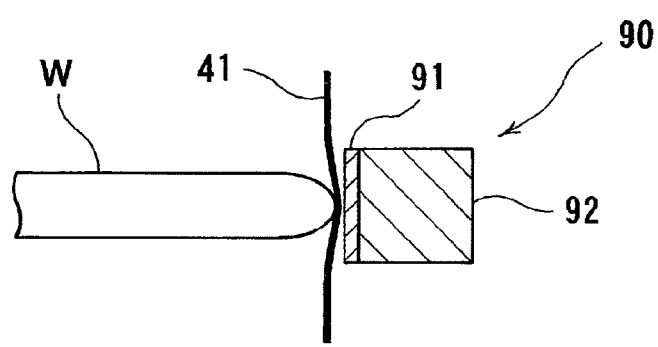
FIG. 15B is a vertical cross-sectional view of the press pad shown in FIG. 15A.

FIG. 15A is a cross-sectional view showing a press pad used in the polishing apparatus according to the second embodiment of the present invention, and FIG. 15B is a vertical cross-sectional view of the press pad shown in FIG. 15A. As shown in FIG. 15A and FIG. 15B, a press pad 90 has a plate-shaped hard member 91 having a pressing surface 91a for pressing the bevel portion of the wafer W via the polishing tape 41 and a soft elastic member 92 supporting the hard member 91. The hard member 91 has substantially the same shape as the above-described hard member 51, and a width (i.e., a dimension along the circumferential direction of the wafer W) of the hard member 91 is larger than a height (i.e., a dimension along the direction perpendicular to the surface of the wafer W) thereof.

The hard member 91 is made from rigid plastic (rigid resin), such as PVC (polyvinyl chloride) or PET (polyethylene terephthalate), or metal such as SUS (stainless steel). The elastic member 92 is made from foamed resin, such as silicon sponge. The hard member 91 is secured to the elastic member 92 with glue or the like. Thus, the press pad 90 has a double-layer structure comprising the hard member (hard layer) 91 and the elastic member (soft layer) 92. As with the above-described first embodiment, only a central portion of the hard member 91 may be fixed to the elastic member 92.

Figure 16:
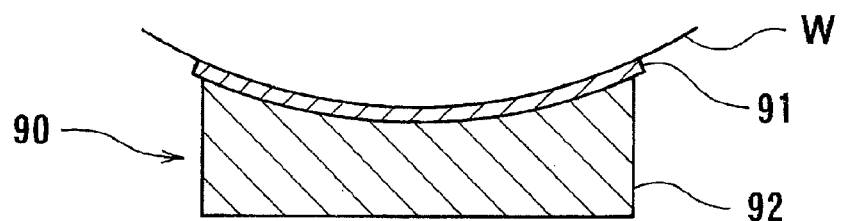
FIG. 16 is a cross-sectional view showing the press pad shown in FIG. 15A when polishing the wafer.

When the above-described press pad 90 is pressed against the bevel portion of the wafer W, the hard member 91 is bent along the circumferential direction of the wafer W as shown in FIG. 16 and the elastic member 92 is deformed as the hard member 91 is bent. Therefore, it is preferable that the elastic member 92 have such a flexibility as not to prevent the deformation of the hard member 91. Although the polishing tape 41 is not shown in FIG. 16 for the purpose of simplifying explanation, the press pad 90 presses the polishing tape 41 against the bevel portion of the wafer W during polishing, as shown in FIG. 15B.

According to the present embodiment, because the hard member 91 in its entirety is bent as with the above-described embodiment, the pressing surface 91a contacts the bevel portion of the wafer W over an entire length of the pressing surface 91a. Therefore, the contact area between the polishing tape 41 and the wafer W can be increased. Further, since the elastic member 92 is deformed during polishing, the elastic member 92 can press the hard member 91 uniformly in its entirety.

A material and a thickness of the hard member 91 are selected on conditions that an amount of deformation of the hard member 91 in the height direction (i.e., a radius of curvature) during polishing is larger than a curvature of the vertical cross section of the bevel portion of the wafer W and an amount of deformation of the hard member 91 in the width direction (i.e., a radius of curvature) during polishing is smaller than a radius of the wafer W. On the other hand, a material and a thickness of the elastic member 92 are selected on condition that the elastic member 92 can press the hard member 91 substantially uniformly against the bevel portion of the wafer W during polishing.

Figure 17A:
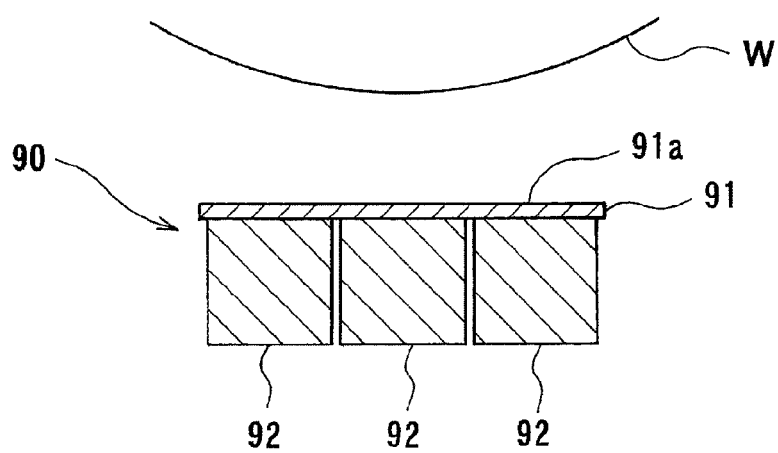
FIG. 17A is a cross-sectional view showing another example of the press pad.
Figure 17B:
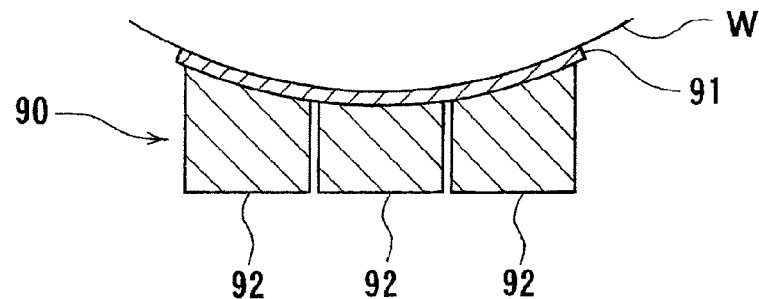
FIG. 17B is a cross-sectional view showing the press pad when pressing the wafer.

FIG. 17A is a cross-sectional view showing another example of the press pad and FIG. 17B is a cross-sectional view showing a state in which the press pad is pressed against the wafer. The press pad 90 shown in FIG. 17A and FIG. 17B is different from the press pad shown in FIG. 16 in that the press pad 90 has a plurality of elastic members 92 arranged along the circumferential direction of the wafer W.

Figure 18A:
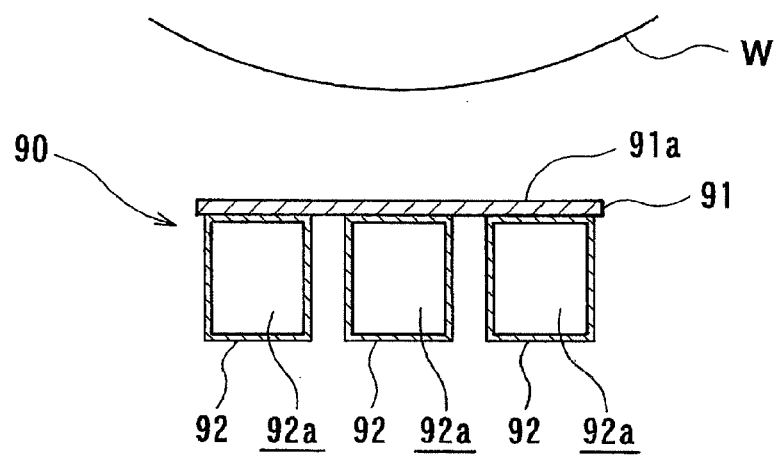
FIG. 18A is a cross-sectional view showing another example of the press pad.
Figure 18B:
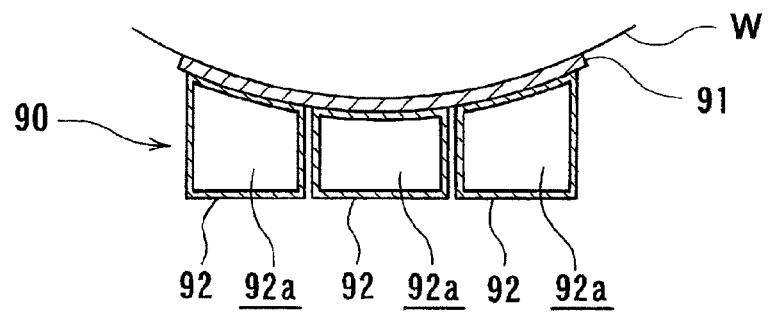
FIG. 18B is a cross-sectional view showing the press pad when pressing the wafer.

FIG. 18A is a cross-sectional view showing another example of the press pad and FIG. 18B is a cross-sectional view showing a state in which the press pad is pressed against the wafer. The press pad shown in FIG. 18A and FIG. 18B is different from the press pad shown in FIG. 16 in that the press pad has a plurality of elastic members 92 arranged along the circumferential direction of the wafer W and that fluid chambers 92a are formed in these elastic members 92 respectively. The elastic members 92 in this example are made from silicon rubber or the like and a pressurizing fluid, such as pure water or air, is enclosed in the respective fluid chambers 92a in advance. Only one elastic member may be provided and one or more fluid chambers may be provided in this single elastic member.

Figure 19A:
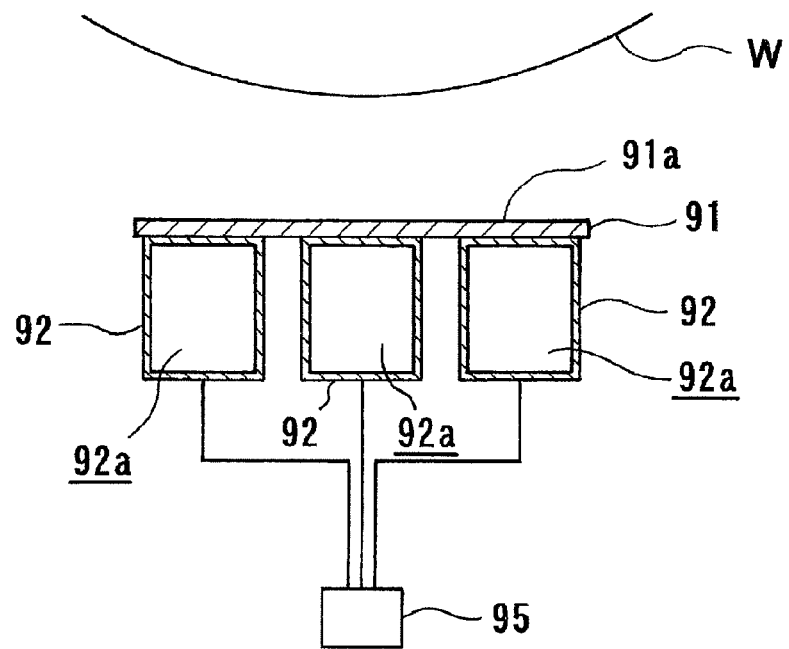
FIG. 19A is a cross-sectional view showing another example of the press pad.
Figure 19B:
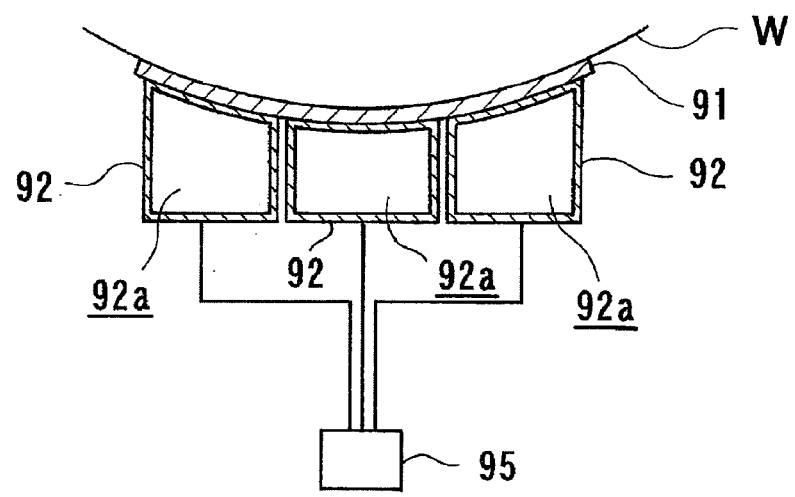
FIG. 19B is a cross-sectional view showing the press pad when pressing the wafer.

FIG. 19A is a cross-sectional view showing another example of the press pad and FIG. 19B is a cross-sectional view showing a state in which the press pad is pressed against the wafer. The press pad shown in FIG. 19A and FIG. 19B is different from the press pad shown in FIG. 18A and FIG. 18B in that a pressure adjuster 95 is coupled to the respective fluid chambers 92a. This pressure adjuster 95 comprises a fluid supply source, such as a pump, and a plurality of regulators communicating with the fluid chambers 92a respectively. The pressure adjuster 95 is configured to supply a pressurizing gas (e.g., pressurizing air) into the respective fluid chambers 92a independently. Therefore, internal pressures of the respective fluid chambers 92a can be adjusted independently by the pressure adjuster 95.

Hereinafter, experimental examples conducted using various types of press pads according to the present embodiment with different materials and different thicknesses of the hard member 91 and the elastic member 92 and using various types of polishing tapes 41 with different diameters of abrasive particles (i.e., different roughness of the polishing surface) and different thicknesses of the base member will be described with reference to FIG. 20. In FIG. 20, an index indicating whether the central region of the bevel portion is polished more easily than the boundary is defined as "polishing position controllability" and a length of the hard member (i.e., the polishing tape) along the circumferential direction of the wafer W is defined as "polishing rate."

Experimental Example 1

This experiment was conducted in order to examine effects of thickness of the hard member on polishing results.

The experiment was conducted under the following conditions.

Diameter of the abrasive particles (diamond particles) of the polishing tape: 5 m (#4000)

Thickness of the base member of the polishing tape: 25 μm

The hard member: PET

The elastic member: silicon sponge with a hardness of 30 degrees

Under the above conditions, the experiment was conducted using several hard members having different thicknesses in a range of 25 μm to 100 μm. The experiment results have shown that polishing progresses more rapidly at the boundaries than at the central region when using the thinnest hard member with a thickness of 25 μm and that the central region of the bevel portion is more easily polished as the thickness of the hard member increases. On the other hand, the experiment results have further shown that, as the thickness of the hard member increases, the contact area between the polishing tape and the wafer W decreases and the polishing rate is lowered. This is because the length of the hard member (i.e., the polishing tape) along the circumferential direction of the wafer is decreased as a result of using the thick hard member.

In summary, these experimental results show that there is a trade-off relationship between the polishing position controllability and the polishing rate. Specifically, when a thin hard member is used, a good polishing rate is obtained, but on the other hand good polishing position controllability is not obtained. On the contrary, when a thick hard member is used, good polishing position controllability is obtained, but the polishing rate is lowered.

In view of these results, an experiment was further conducted using the hard member having a thickness of 100 μm and the elastic member having a hardness of 10 degrees in order to improve both the polishing position controllability and the polishing rate. As a result, the central region of the bevel portion was polished better than the boundaries and the polishing rate was improved. This is because the length of the hard member along the circumferential direction of the wafer was increased as a result of using the elastic member having a lowered hardness.

Experimental Example 2

In this experiment, effects of diameter of abrasive particles of the polishing tape on polishing results were examined. The experiment was conducted using a polishing tape having abrasive particles with a diameter of 0.2 μm (#10000) and a base member with a thickness of 50 μm under the same conditions as those in the above-described experimental example 1 where the good results were obtained with respect to both the polishing position controllability and the polishing rate. As a result, the polishing position controllability was lowered. This is because the polishing tape using the abrasive particles with small diameters have a low grinding ability and the polishing surface of the polishing tape cannot reach the central region. In contrast, as shown in the experimental example 1, the abrasive particles with large diameters have a high grinding ability, and as such, even if the polishing surface of the polishing tape contacts only the boundaries at first, these boundaries are polished to allow the polishing surface to reach the central region to thereby polish the central region. From these results, it can be seen that the size of the abrasive particles of the polishing tape also affects the polishing position controllability.

In view of the experiment results, an experiment was further conducted using a hard member with a larger thickness. As a result, the polishing position controllability was improved, and on the other hand the polishing rate was lowered, as with the experimental example 1. Next, a thin plate, which was made from stainless steel, with a thickness of 0.5 mm was used as the hard member. As a result, the polishing position controllability was kept well, and the polishing rate was improved. An experiment was further conducted using a thinner hard member with the beams 61 provided on the rear surface of the hard member as shown in FIG. 14B. This hard member was made from stainless steel and had a thickness of 0.1 mm. As a result, the polishing position controllability and the polishing rate were both improved.

Experimental Example 3

In this experiment, effects of hardness of the elastic member on polishing results were examined. The polishing tape having abrasive particles with a diameter of 0.2 μm (#10000) and having the base member with a thickness of 50 μm was used. A thin plate of PVC having a thickness of 0.5 mm was used as the hard member. The experiment was conducted using several elastic members with different hardnesses and structures. Specifically, the experiment was conducted using, as the elastic member, a sponge having a hardness of 30 degrees (according to the embodiment shown in FIG. 15), a sponge having a hardness of 10 degrees (according to the embodiment shown in FIG. 15), the elastic members retaining pure water therein (according to the embodiment shown in FIG. 18), and the airbag-type elastic members retaining the pressurizing air therein (according to the embodiment shown in FIG. 19).

As a result, the polishing rate was improved by changing the hardness of the sponge from 30 degrees to 10 degrees because the hard member was able to easily follow the circumferential direction of the wafer. The elastic members retaining the pure water therein were able to allow the hard member and the polishing tape to be bent so as to follow the shape of the wafer in the circumferential direction thereof. Therefore, the polishing rate was improved compared with a case of using the elastic member composed of sponge as a single material. Further, in the case of using the elastic members in which the controlled pressures were supplied to the respective fluid chambers (i.e., air bags) as shown in FIG. 19, the polishing rate was further improved.

In this manner, the optimal combination of the thickness of the base member of the polishing tape, the diameter of the abrasive particles (i.e., roughness of the polishing surface), the material and thickness of the hard member, and the hardness of the elastic member can improve both the polishing position controllability and the polishing rate. While the above-described experimental examples show cases in which the thickness of the hard member was changed in the range of 25 μm to 2 mm and the hardness of the elastic member made from sponge was changed in the range of 10 to 30 degrees, these numerical ranges may be modified appropriately depending on the diameter of the abrasive particles and the thickness of the base member of the polishing tape.

When using a polishing tape having abrasive particles with a large diameter, even if a polishing surface of the polishing tape does not contact the central region of the bevel portion at the initial stage of polishing, the polishing tape can reach the central region as polishing progresses. Therefore, it is preferable to conduct tentative polishing for a predetermined period of time and select the thickness of the hard member from the viewpoint of whether the polishing surface of the polishing tape has reached the central region of the bevel portion. The hardness of the elastic member is selected such that the hard member can follow the wafer with the longest length in the circumferential direction of the wafer. In this manner, optimal polishing for the polishing tape can be performed by the steps of providing different types of hard members and different types of elastic members; fabricating a press pad from a hard member and an elastic member selected; performing tentative polishing using the press pad; repeating the fabricating of the press pad and the tentative polishing; and performing main polishing using the hard member and elastic member which have obtained the best polishing results (polishing capability) in the tentative polishing.

Figure 1:
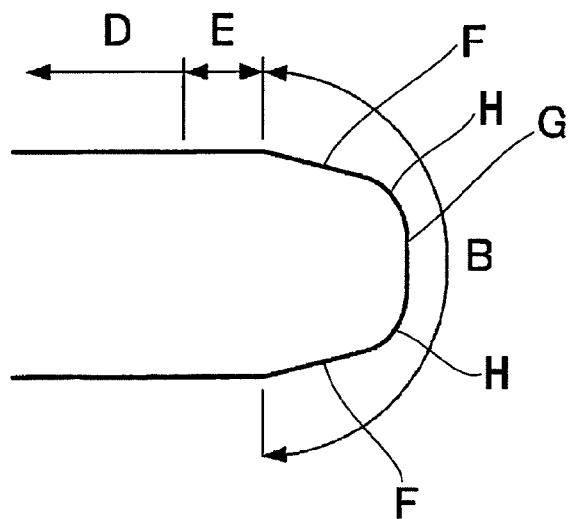
FIG. 1 is a cross-sectional view showing a periphery of a substrate.
Figure 2:
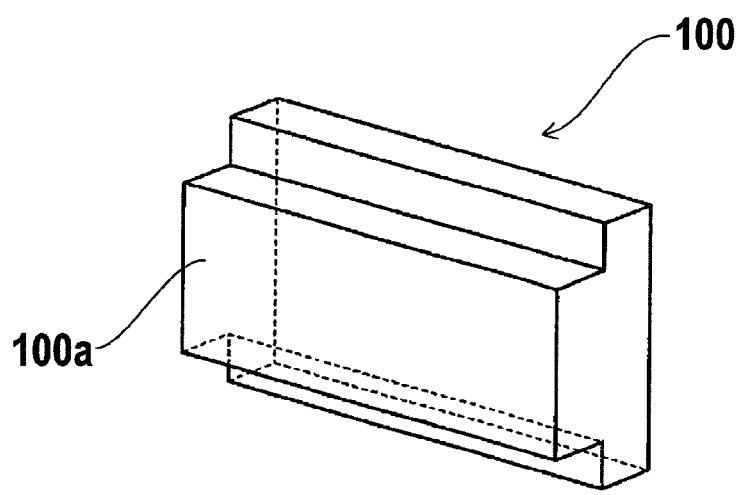
FIG. 2 is a perspective view showing a conventional press pad.
Figure 3:
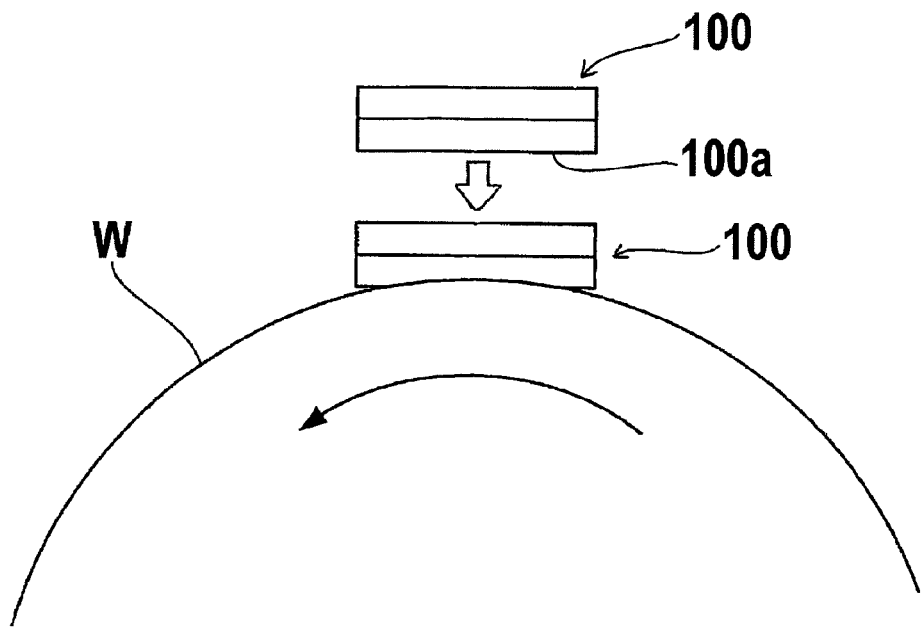
FIG. 3 is a plan view showing the press pad when pressing a wafer and when not pressing the wafer.
Figure 4:
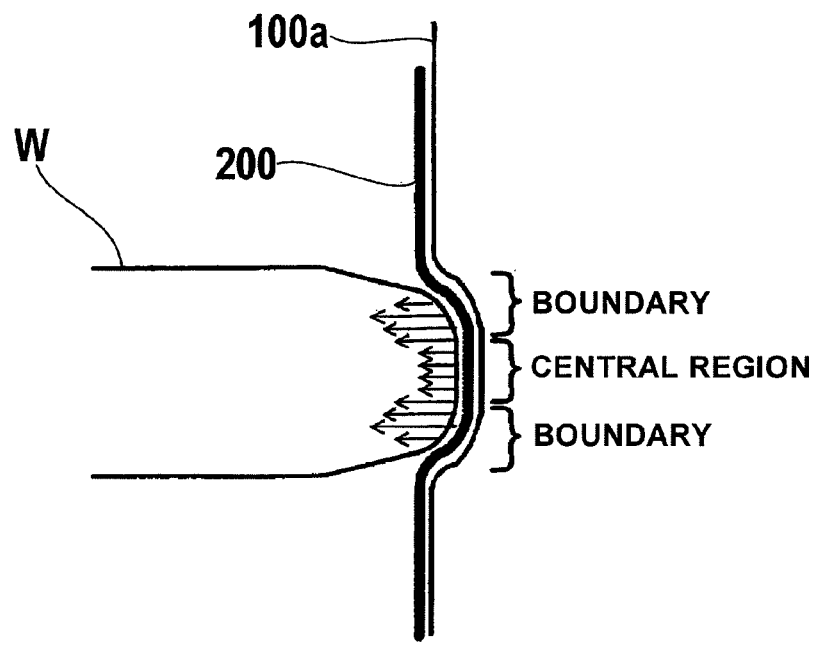
FIG. 4 is a vertical cross-sectional view showing the press pad when pressing a polishing tape against a bevel portion of a wafer.

The polishing apparatus may have a tilting mechanism for tilting the polishing head around the bevel portion (B in FIG. 1) of the wafer to be polished. This tilting mechanism brings the polishing tape into contact with the bevel portion starting from the upper surface thereof (the upper slope surface F shown in FIG. 1) to the lower surface thereof (the lower slope surface F) continuously to thereby enable the polishing tape to polish the bevel portion in its entirety. Further, it is also possible to continuously change a tilt angle of the polishing head during polishing so as to bring the polishing tape into contact with the bevel portion starting from the upper surface thereof to the lower surface thereof and then from the lower surface to the upper surface. By using the press pad of the present invention in the tilting mechanism, the bevel portion in its entirety can be polished more effectively.

INDUSTRIAL APPLICABILITY

The present invention is applicable to a polishing apparatus for polishing a bevel portion of a substrate, such as a semiconductor wafer.

The invention claimed is:

1. A polishing apparatus comprising:
a substrate holder configured to hold and rotate a substrate;
a press pad configured to press a belt-shaped polishing tool having a polishing surface against a bevel portion of the substrate held by said substrate holder; and
a feeding mechanism configured to cause the belt-shaped polishing tool to travel in its longitudinal direction,
wherein said press pad includes
a hard member having a pressing surface for pressing the belt-shaped polishing tool against the bevel portion of the substrate, said hard member being bendable in its entirety along a circumferential direction of the substrate, and
at least one elastic member for pressing said hard member to press the belt-shaped polishing tool against the bevel portion of the substrate so as to bend said hard member in its entirety along the circumferential direction of the substrate.

2. The polishing apparatus according to claim 1, wherein said hard member is secured to said at least one elastic member only at a central portion of said hard member with respect to the circumferential direction of the substrate.

3. The polishing apparatus according to claim 1, wherein said hard member has a rear surface opposite to said pressing surface, and said rear surface has a plurality of grooves extending in a direction perpendicular to a surface of the substrate held by said substrate holder.

4. The polishing apparatus according to claim 1, wherein said hard member has a rear surface opposite to said pressing surface, and a plurality of reinforcing members, extending in a direction perpendicular to a surface of the substrate held by said substrate holder, are provided on said rear surface.

5. The polishing apparatus according to claim 1, wherein said at least one elastic member comprises a plurality of elastic members arranged along the circumferential direction of the substrate.

6. The polishing apparatus according to claim 1, wherein said at least one elastic member has at least one fluid chamber therein, and said at least one fluid chamber is filled with fluid.

7. The polishing apparatus according to claim 6, further comprising a pressure adjuster, wherein
said at least one fluid chamber comprises a plurality of fluid chambers, and
said pressure adjuster is configured to adjust internal pressures of said fluid chambers independently.

8. A polishing method comprising:
holding and rotating a substrate;
moving a belt-shaped polishing tool in its longitudinal direction; and
pressing, with a press pad, a polishing surface of the belt-shaped polishing tool against a bevel portion of the substrate to polish the bevel portion, the press pad having a hard member bendable in its entirety along a circumferential direction of the substrate and an elastic member, the hard member facing a rear surface of the belt-shaped polishing tool,
wherein said pressing includes bending the hard member in its entirety along the circumferential direction of the substrate.

* * * * *